US010340721B2

(12) United States Patent
Song

(10) Patent No.: US 10,340,721 B2
(45) Date of Patent: Jul. 2, 2019

(54) WIRELESS CHARGER WITH CONNECTOR

(71) Applicant: LG INNOTEK CO., LTD., Seoul (KR)

(72) Inventor: Young Kil Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 399 days.

(21) Appl. No.: 15/163,389

(22) Filed: May 24, 2016

(65) Prior Publication Data

US 2016/0372958 A1 Dec. 22, 2016

(30) Foreign Application Priority Data

Jun. 16, 2015 (KR) .................. 10-2015-0085022

(51) Int. Cl.
| | |
|---|---|
| *H05K 1/02* | (2006.01) |
| *H05K 1/14* | (2006.01) |
| *H05K 3/32* | (2006.01) |
| *H05K 7/02* | (2006.01) |
| *H02J 50/10* | (2016.01) |
| *H05K 1/18* | (2006.01) |
| *H05K 3/34* | (2006.01) |
| *H02J 50/70* | (2016.01) |

(Continued)

(52) U.S. Cl.
CPC ............ *H02J 7/025* (2013.01); *H02J 7/0042* (2013.01); *H02J 50/10* (2016.02); *H02J 50/70* (2016.02); *H05K 1/0216* (2013.01); *H05K 1/0296* (2013.01); *H05K 1/14* (2013.01); *H05K 1/181* (2013.01); *H05K 3/32* (2013.01); *H05K 3/341* (2013.01); *H05K 3/3415* (2013.01); *H05K 7/02* (2013.01); *H05K 2201/095* (2013.01)

(58) Field of Classification Search
CPC .......... H02J 7/025; H02J 7/0042; H02J 50/70; H02J 50/10; H05K 1/0216; H05K 1/181; H05K 1/0296; H05K 1/14; H05K 3/341; H05K 3/32; H05K 3/3415; H05K 7/02; H05K 2201/095
USPC .................. 320/108; 307/104; 174/260, 261; 361/760
See application file for complete search history.

(56) References Cited

U.S. PATENT DOCUMENTS

| | | | |
|---|---|---|---|
| 8,767,407 B2* | 7/2014 | Lim ..................... | H05K 9/0028 174/359 |
| 2003/0107881 A1* | 6/2003 | Muramatsu .......... | H01Q 1/1207 361/818 |

(Continued)

FOREIGN PATENT DOCUMENTS

| | | |
|---|---|---|
| CN | 101523693 A | 9/2009 |
| CN | 102611215 A | 7/2012 |

(Continued)

*Primary Examiner* — Nathaniel R Pelton
*Assistant Examiner* — Manuel Hernandez
(74) *Attorney, Agent, or Firm* — Birch, Stewart, Kolasch & Birch, LLP

(57) ABSTRACT

A wireless charging device includes a transmitter configured to transmit a power signal for wireless charging, a circuit board including at least one component configured to control an operation of the transmitter, a shielding plate configured to block an electrical interference between the transmitter and the circuit board, and a connector configured to penetrate through the circuit board and the shielding plate so as to electrically connect the transmitter with the at least one component.

18 Claims, 5 Drawing Sheets

(51) Int. Cl.
*H02J 7/00* (2006.01)
*H02J 7/02* (2016.01)

(56) References Cited

U.S. PATENT DOCUMENTS

| | | | | |
|---|---|---|---|---|
| 2012/0098349 A1* | 4/2012 | Kim | ............... | H04B 5/0037 |
| | | | | 307/104 |
| 2012/0098484 A1* | 4/2012 | Cheng | ............... | H01F 38/14 |
| | | | | 320/108 |
| 2013/0015718 A1* | 1/2013 | Jung | ............... | H04B 5/0037 |
| | | | | 307/104 |
| 2013/0106198 A1* | 5/2013 | Kuk | ............ | H01F 38/14 |
| | | | | 307/104 |
| 2014/0232607 A1* | 8/2014 | Lee | ............ | H01Q 1/526 |
| | | | | 343/841 |
| 2014/0302782 A1* | 10/2014 | Raab | ............... | H04B 5/0037 |
| | | | | 455/41.1 |
| 2015/0123603 A1* | 5/2015 | Yang | ............... | H02J 7/025 |
| | | | | 320/108 |
| 2018/0061565 A1* | 3/2018 | Leem | ............... | H02J 50/10 |

FOREIGN PATENT DOCUMENTS

| | | | |
|---|---|---|---|
| CN | 102906828 A | | 1/2013 |
| CN | 103168405 A | | 6/2013 |
| KR | 20020085615 A | * | 11/2002 |
| KR | 10-2012-0008200 A | | 1/2012 |
| KR | 10-2012-0040779 A | | 4/2012 |

\* cited by examiner

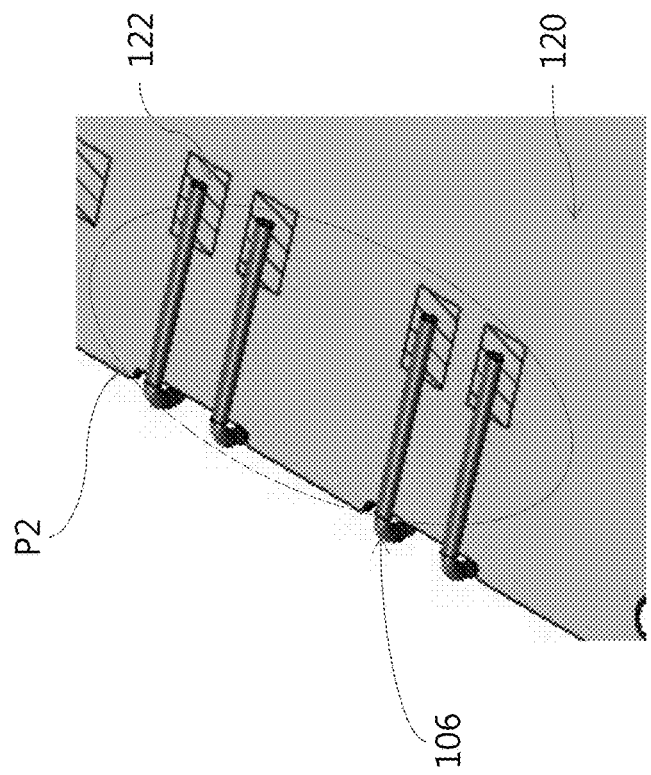
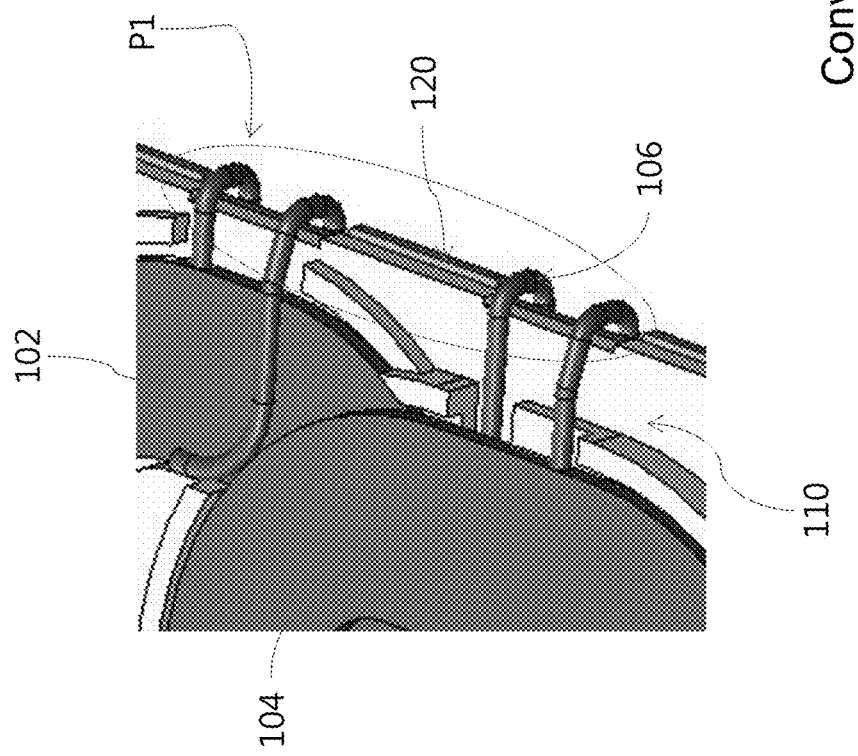
FIG.1
Conventional Art

WIRELESS CHARGER WITH CONNECTOR

CROSS-REFERENCE TO RELATED APPLICATION

This application claims priority to and the benefit of Korean Patent Application No. 10-2015-0085022, filed on Jun. 16, 2015 in the Korean Intellectual Property Office, the disclosure of which is hereby incorporated by reference as if fully set forth herein.

TECHNICAL FIELD

The disclosure relates to a wireless charger, and more particularly, to a wireless charger having an advanced structure for durability of a charging pad including a coil or an antenna.

BACKGROUND

A wireless charging technology relates to a method using an electromagnetic induction to make a current flow for charging a battery so that a magnetic field generated from a first coil in a charging pad induces an electromotive force across a second coil coupled to the battery. The wireless charging technology can be applicable to a communication device or an electric vehicle which requires a massive battery. The wireless charging technology has advantages of reducing a risk such as a leakage current because there are no exposed points of contact and overcoming a poor or faulty performance caused by a defective wire.

As a wireless charging technique becomes widespread, various charging pads have been suggested to supply wireless power signals. Generally, a charging pad includes a board or a plate including a coil, or an antenna, transmitting a wireless power signal and a circuit supplying, or controlling, the wireless power signal with the coil or the antenna according to a wireless charging technology.

FIG. 1 shows a conventional structure of a wireless charging device 100.

As shown, the wireless charging device 100 includes a shielding plate fastening at least one coil 102, 104 and a circuit board 120 supplying a power into the coil 102, 104. In order to reduce an overall size of the wireless charging device 100 and to avoid that a noise occurred at the circuit board 120 interrupts or interferes a performance of the coil 102, 104, the coil 102, 104 and the circuit board 120 can be placed on opposite sides of the shielding plate 110. The coil 102, 104 can be coupled with the circuit board 120 via a coil lead wire 106.

The coil lead wire 106 is bent to electrically connect the coil 102, 104 to a connection port 122 of the circuit board 120 which is placed on the opposite side of the shielding plate 110. The coil lead wire 106 is soldered onto the connection port 122. To solder the coil lead wire 106 onto the connection port 122, the coil lead wire 106 should be long enough to indurate a part of the coil lead wire 106 with an epoxy so as to protect a soldering portion of the coil lead wire 106 and to prevent a wire snaps by an excessive force. Thus, soldering between the connection port 122 and the coil lead wire 106 can make a wasted space P2 from an edge where the coil lead wire 106 is bent to the connection port 122 of the circuit board 120. The wasted space P2 can be an obstacle to arranging plural components on the circuit board effectively and miniaturizing the wireless charging device 100.

Further, as long as the coil lead wire 106 surrounds edges of the shielding plate 110 and the circuit board 120, the coil lead wire 106 should be bent. The bent coil lead wire 106 might become two week for an external force such as a vibration. If the coil lead wire 106 is exposed to an external force such as a vibration for many hours, a bent portion of the coil lead wire 106 could be damaged or cut off. This can be a disadvantage in durability of a wireless charger.

SUMMARY

In a wireless charging device, durability can be enhanced because there is no bent portion of a coil lead wire included therein.

Further, in a condition or a circumstance where a wireless charging device can be influenced by an external force such as a vibration, the wireless charging device can operate stably and its durability can be improved.

Further, since a space for soldering a coil lead wire on a circuit board can be removed, a space for arranging plural components on the circuit board can become sufficient or a wireless charging device can be smaller.

A wireless charging device can include a transmitter configured to transmit a power signal for wireless charging; a circuit board including at least one component configured to control an operation of the transmitter; a shielding plate configured to block an electrical interference between the transmitter and the circuit board; and a connector configured to penetrate through the circuit board and the shielding plate so as to electrically connect the transmitter with the at least one component.

The transmitter and the circuit board can be arranged on front and rear sides of the shielding plate respectively.

Each of the circuit board and the shielding plate can include plural holes where the connector is placed.

The connector can include a lead wire guiding part configured to avoid that a lead wire prolonged from the transmitter strays; a connection part configured to pass through the lead wire guiding part so as to be coupled with the lead wire; and a fastening part configured to penetrate through the circuit board and the shielding plate.

The lead wire guiding part, the connection part and the fastening part can include the same conductive material.

The lead wire guiding part, dislike the connection part and the fastening part, can include a nonconductive material.

The fastening part can be a structure of plane including a conductive material soldered with the lead wire.

The lead wire guiding part can include a groove where the lead wire is inserted.

The groove can include a first part of which a width is same as a diameter of the lead wire; and a second part of which a width is less than the diameter of the lead wire but flexible to get wider as the diameter of the lead wire. Herein, the second part can include a curved plane to reduce a frictional force when the lead wire is inserted.

The fastening part can have a pin-type structure prolonged from the connection part. Herein, each of the connection part is extended into two fastening parts.

The fastening part can include a body configured to penetrate through the circuit board and the shielding plate; a deviation block part configured to avoid that the connection part deviates freely after fastened through the shielding plate; and a movement block part configured to avoid that the connection part moves according to vibration after fastened through the shielding plate.

A thickness of the body can be smaller than a diameter of a hole formed in the shielding plate.

The deviation block part and the movement block part can be protruded or bent from the body in the opposite direction with each other.

A thickness of the connection part including the deviation block part and the movement block part can be larger in a plane dimension of the shielding plate than the diameter of the hole.

The hole formed in the shielding plate can include a first portion having a diameter which is larger than a first thickness of the body, the deviation block part and the movement block part; and a second portion having a diameter which is engaged with a second thickness of the body and the movement block part.

The circuit board can be a printed circuit board (PCB) including a printed wire for connecting the at least one component with the connector.

The shielding plate can include a soldering barrier configured to fix a soldering position when the transmitter is coupled with the connector by soldering and to block a leak of current to an external of the shielding plate.

The transmitter can include at least one coil or antenna configured to transmit the power signal.

The shielding plate can include a material compounded from a Sendust and a Poly Amide.

The effects obtained from the disclosure are not limited to the above-described effects and the other advantages of the present invention will be more clearly understood from the following detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 shows a conventional structure of a wireless charging device;

DETAILED DESCRIPTION

Figure 2:
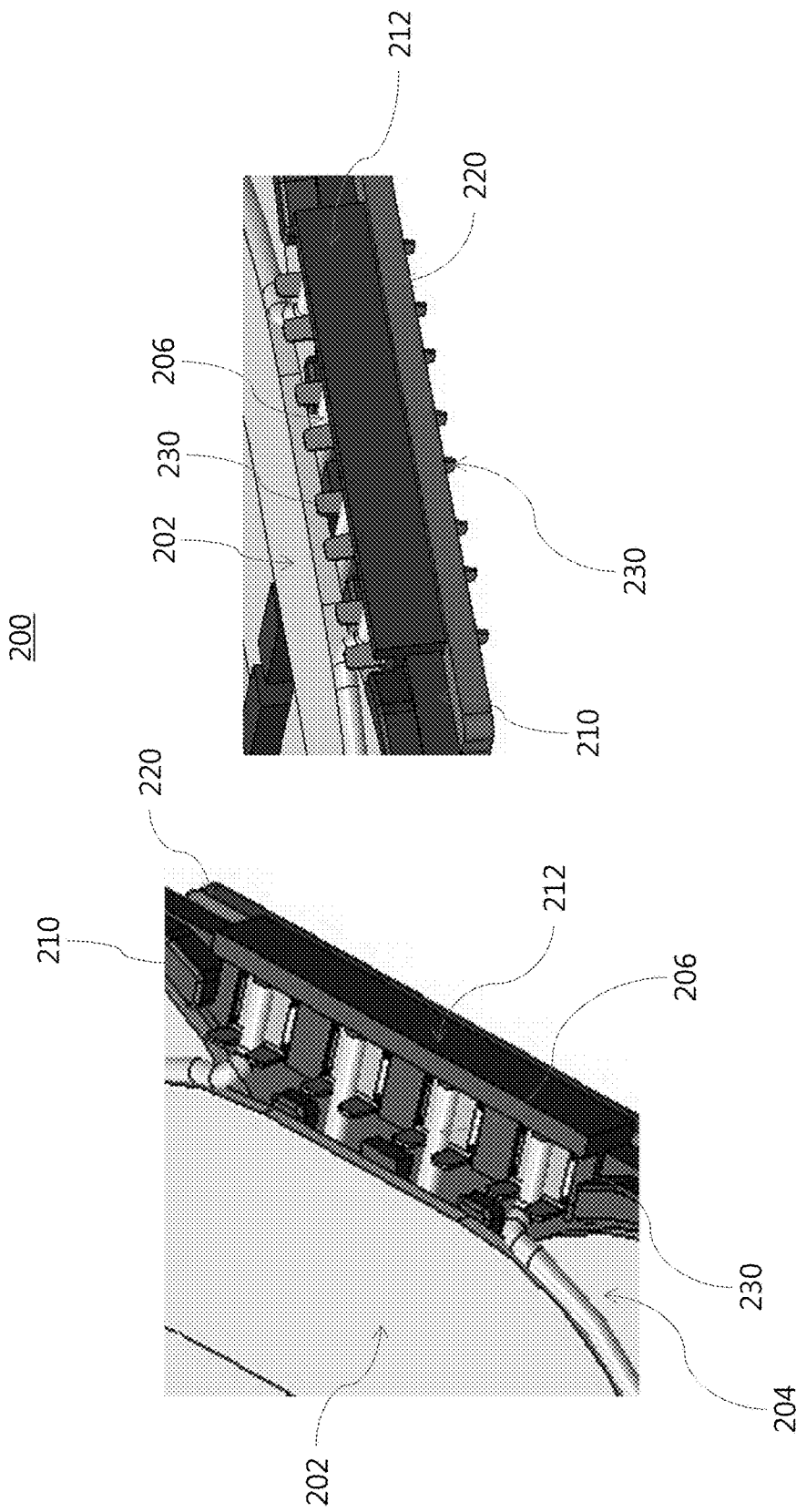
FIG. 2 shows a wireless charging device.

Reference will now be made in detail to the preferred embodiments of the invention, examples of which are illustrated in the accompanying drawings. In the drawings, the same elements are denoted by the same reference numerals, and a repeated explanation thereof will not be given. The suffixes "module" and "unit" of elements herein are used for convenience of description and thus can be used interchangeably and do not have any distinguishable meanings or functions.

In the following description of the embodiments, it will be understood that, when each element is referred to as being formed "on" or "under" the other element, it can be directly "on" or "under" the other element or be indirectly formed with one or more intervening elements therebetween.

In addition, it will also be understood that "on" or "under" the element may mean an upward direction and a downward direction of the element.

The terms "a" or "an", as used herein, are defined as one or more than one. The term "another", as used herein, is defined as at least a second or more. The terms "including" and/or "having" as used herein, are defined as comprising (i.e. open transition). The term "coupled" or "operatively coupled" as used herein, is defined as connected, although not necessarily directly, and not necessarily mechanically.

In the description of the invention, certain detailed explanations of related art are omitted when it is deemed that they may unnecessarily obscure the essence of the invention. The features of the invention will be more clearly understood from the accompanying drawings and should not be limited by the accompanying drawings. It is to be appreciated that all changes, equivalents, and substitutes that do not depart from the spirit and technical scope of the invention are encompassed in the invention.

FIG. 2 shows a wireless charging device 200.

As shown, the wireless charging device 200 includes a transmitter 202, 204 configured to transmit a power signal for wireless charging, a circuit board 220 including at least one component configured to control an operation of the transmitter 202, 204, and a shielding plate 210 configured to block an electrical interference between the transmitter 202, 204 and the circuit board 220. Further the wireless charging device 220 includes a connector 230 configured to penetrate through the circuit board 220 and the shielding plate 210 so as to electrically connect the transmitter 202, 204 with the at least one component included in the circuit board 220. Herein, the connector 230 can be placed on the shielding plate 210 and protruded from the circuit board 220 after penetrating through the circuit board 220 and the shielding plate 210.

The transmitter 202, 204 can include at least one coil or antenna configured to transmit the power signal. Herein, FIG. 2 shows an example of the transmitter 202, 204 including coils.

By the way of example but not limitation, the circuit board 200 can be a printed circuit board (PCB) including a printed wire for connecting the at least one component with the connector 230.

The transmitter 202, 204 and the circuit board 220 can be arranged on front and rear sides of the shielding plate 210 respectively. The shielding plate 210 and the circuit board 220 can include plural holes (not shown) where the connector 230 is placed.

In order that a noise occurred from the circuit board 220 does not affect an operation of the transmitter 202, 204, the shielding plate 210 can be placed between the transmitter 202, 204 and the circuit board 220. The shielding plate 210 can include a shielding material which can be processed by an injection molding so that the shielding plate should block an electrical interference between the circuit board 220 and the transmitter 202, 204 as well as have a complex structure where the connector 230 can be fastened. By the way of example but not limitation, the shielding plate 210 can include a compounded material of Sendust and Poly Amide in order to improve performance of both an interference shielding and a flexible molding.

A coil lead wire 206 prolonged from the transmitter 202, 204 can be coupled to the connector 230. The coil lead wire 206 if coupled to the connector 230 cannot deviate from the shielding plate 210 because of a soldering barrier 212. The soldering barrier 212 can fix a soldering position when the transmitter 202, 204 is coupled with the connector 230 by soldering, and block a leak of current to an external of the shielding plate 210.

Figure 3:
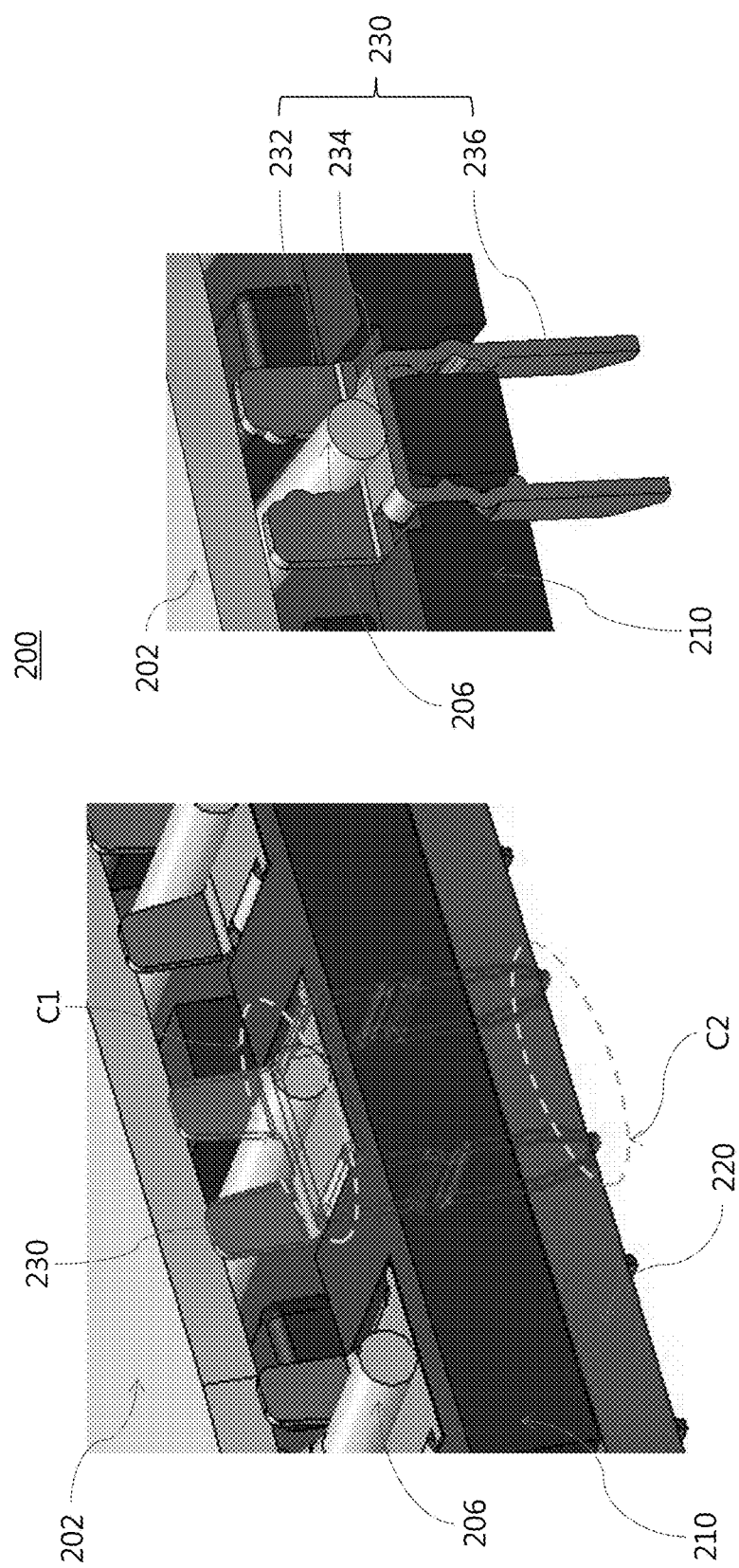
FIG. 3 describes an electrical connection between a transmitter and a circuit board shown in FIG. 2.

FIG. 3 describes an electrical connection between the transmitter 202 and the circuit board 220 shown in FIG. 2.

As shown, the coil lead wire 206 prolonged from the transmitter 202 can touch the connector 230 (referring to a portion 'C1'). The connector 230 can protrude from the circuit board 220 after penetrating through the shielding plate 210 and the circuit board 220 (referring to a portion 'C2').

The connector 230 can include a lead wire guiding part 232 configured to avoid that the coil lead wire 206 prolonged from the transmitter 202 strays, a connection part 234 configured to pass through the lead wire guiding part 232 so as to be coupled with the coil lead wire 206, and a fastening part 236 configured to penetrate through the circuit board 220 and the shielding plate 210.

Herein, all of the lead wire guiding part 232, the connection part 234 and the fastening part 236 can include the same conductive material (e.g., a metal). Particularly, the connector 230 can be plated with gold for soldering with the coil lead wire 206 as well as the circuit board 220. Further, in another embodiment, dislike the connection part 234 and the fastening part 236, the lead wire guiding part 232 can include a nonconductive material.

Figure 4:
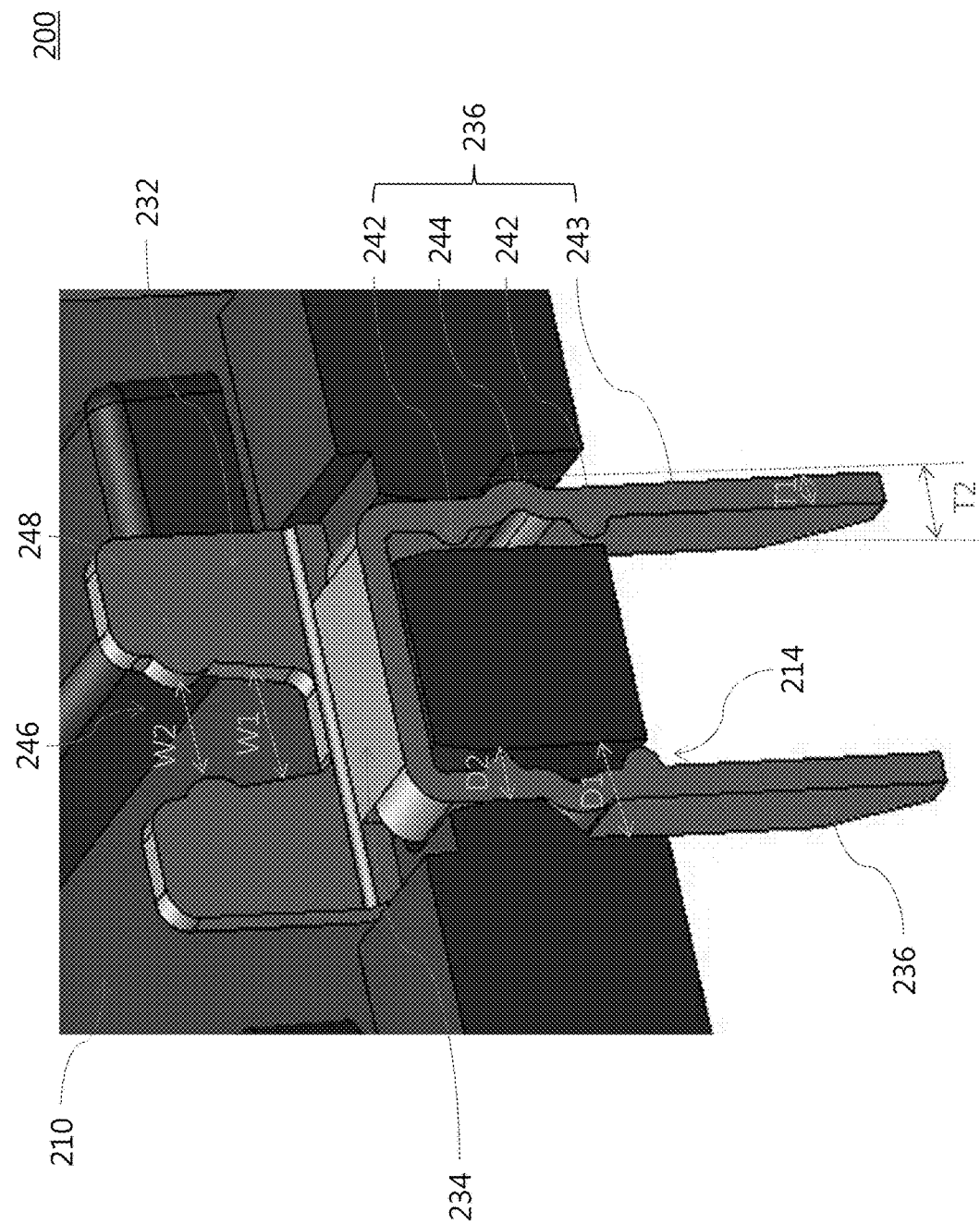
FIG. 4 describes structures of a connector and a shielding plate shown in FIG. 2.

FIG. 4 describes structures of the connector 230 and the shielding plate 210 shown in FIG. 2.

As shown, the fastening part 234 can have a structure of plane including a conductive material soldered with the coil lead wire 206.

The lead wire guiding part 232 can include a groove 246 where the coil lead wire 206 is inserted. The groove 206 can include a first part of which a width W1 is substantially same as a diameter of the coil lead wire 206, and a second part of which a width W2 is less than the diameter of the coil lead wire 206 but flexible to temporarily get wider as the diameter of the coil lead wire 206. Further, the second part can include a curved plane 248 to reduce a frictional force when the coil lead wire 206 is inserted.

Further, the fastening part 236 can have a pin-type structure prolonged from the connection part 234. By the way of example but not limitation, each of the connection part 234 can be extended into two fastening parts 236. Herein, the number of fastening parts 236 can be changed according to an embodiment.

The fastening part 236 can include a body 243 configured to penetrate through the circuit board 220 shown in FIG. 2 and the shielding plate 210, a deviation block part 244 configured to avoid that the connection part 234 deviates freely after fastened through the shielding plate 210, and a movement block part 242 configured to avoid that the connector 230 moves according to vibration after fastened through the shielding plate 210. The deviation block part 244 and the movement block part 242 of the fastening part 236 can be formed at locations which are away from the connection part 234 differently.

The hole 214 formed in the shielding plate 210 can include a first portion having a diameter D1 which is larger than a first thickness T2 of the deviation block part 242, the body 243 and the movement block part 244, and a second portion having a diameter D2 which is engaged with a second thickness of the body 243 and the movement block part 244.

A thickness T1 of the body 243 can be smaller than a diameter D1 of a hole 214 formed in the shielding plate 210. The deviation block part 244 and the movement block part 242 of the fastening part 236 can be protruded or bent from the body 243 in the opposite direction with each other. In a plane dimension of the shielding plate 210, a thickness T2 of the connection part 236 including the deviation block part 244 and the movement block part 242 can be larger than the diameter D1 of the hole 214 but smaller than the diameter D2 of the hole 214.

Figure 5:
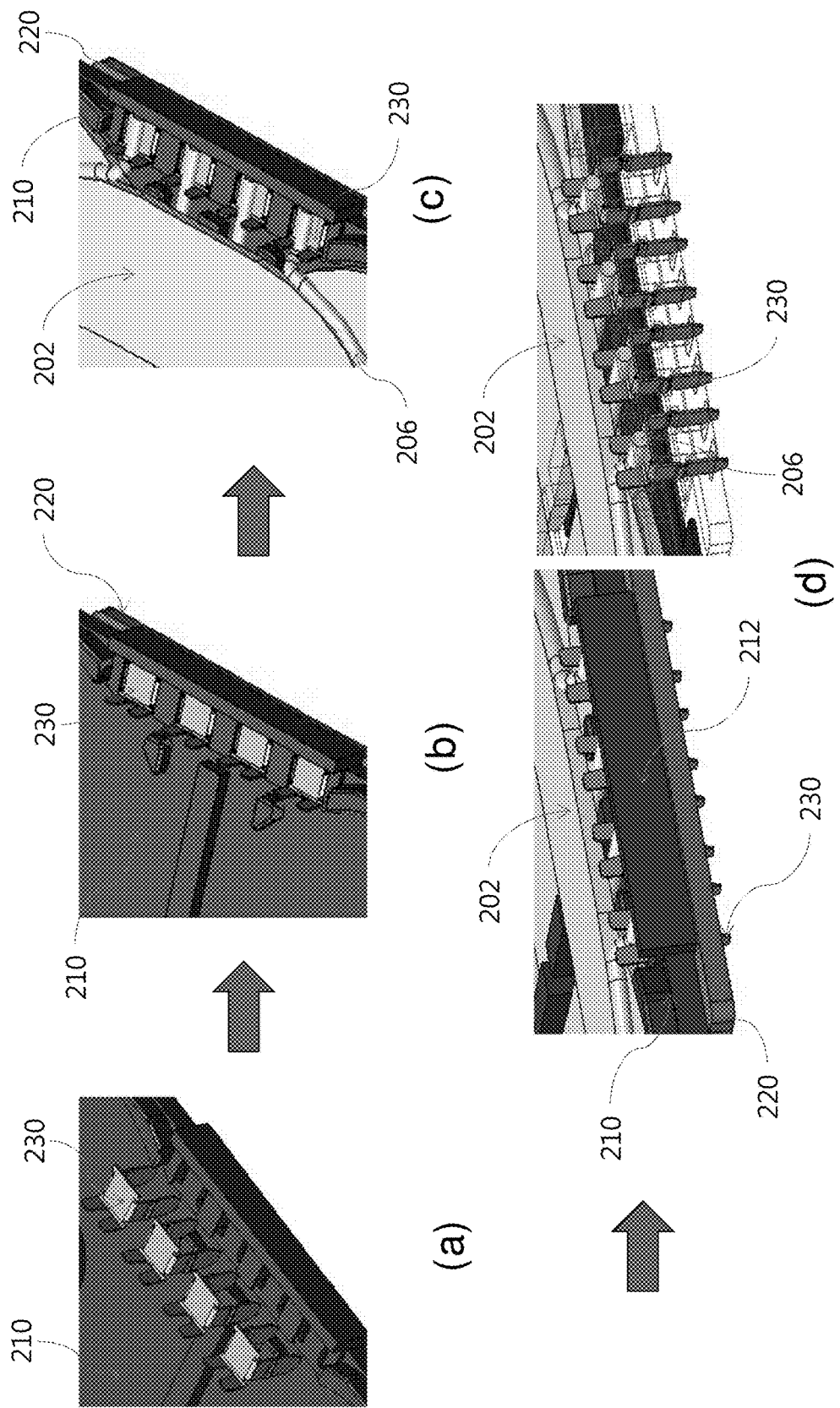
FIG. 5 shows an assembly sequence of the wireless charging device shown in FIG. 2.

FIG. 5 shows an assembly sequence of the wireless charging device shown in FIG. 2.

Referring to (a), the connector 230 can be inserted into the shielding plate 210.

Referring to (b), the circuit board 220 can be coupled on one side of the shielding plate 210 after the connector 230 is inserted into the shielding plate 210.

Referring to (c), the transmitter 202 can be fastened over the other side of the shielding plate 210, and the coil lead wire 206 prolonged from the transmitter 202 can be connected to the connector 230.

Referring to (d), the coil lead wire 206 is connected to the connector 230, but blocked from an external of the shielding plate 210 by the soldering barrier 212. Then, the coil lead wire 206 is electrically connected with the connector 230 by soldering. In order to electrically connect at least one component included in the circuit board 220, a portion of the connector 230 which is protruded from the circuit board 220 can be soldered selectively according to which component should be coupled to the transmitter 202.

In above-described embodiments, a coil lead wire do not need be bent to surround a shielding plate for electrical connection between a coil and a circuit board, and a wireless charging device can be smaller.

In a wireless charging device according to the embodiments, durability against a vibration applied from an external can be enhanced.

The aforementioned embodiments are achieved by combination of structural elements and features of the invention in a predetermined manner. Each of the structural elements or features should be considered selectively unless specified separately. Each of the structural elements or features may be carried out without being combined with other structural elements or features. Also, some structural elements and/or features may be combined with one another to constitute the embodiments of the invention. The order of operations described in the embodiments of the invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

It will be apparent to those skilled in the art that various modifications and variations can be made in the invention without departing from the spirit or scope of the inventions. Thus, it is intended that the invention covers the modifications and variations of this invention provided they come within the scope of the appended claims and their equivalents.

What is claimed is:

1. A wireless charging device, comprising:
 a transmitter configured to transmit a power signal for wireless charging;
 a circuit board including at least one component configured to control an operation of the transmitter;
 a shielding plate configured to block an electrical interference between the transmitter and the circuit board; and a connector configured to penetrate through the circuit board and the shielding plate so as to electrically connect the transmitter with the at least one component, wherein the connector comprises:
- a lead wire guiding part configured to avoid that a lead wire prolonged from the transmitter strays;
- a connection part configured to pass through the lead wire guiding part so as to be coupled with the lead wire; and
- a fastening part configured to penetrate through the circuit board and the shielding plate.

2. The wireless charging device according to claim 1, wherein the transmitter and the circuit board are arranged on front and rear sides of the shielding plate respectively.

3. The wireless charging device according to claim 1, wherein each of the circuit board and the shielding plate includes plural holes where the connector is placed.

4. The wireless charging device according to claim 1, wherein the lead wire guiding part, the connection part and the fastening part include the same conductive material.

5. The wireless charging device according to claim 1, wherein the lead wire guiding part, unlike the connection part and the fastening part, includes a nonconductive material.

6. The wireless charging device according to claim 1, wherein the connection part is a structure of a plane including a conductive material soldered with the lead wire.

7. The wireless charging device according to claim 1, wherein the lead wire guiding part includes a groove where the lead wire is inserted.

8. The wireless charging device according to claim 7, wherein the groove comprises:
- a first part of which a width is same as a diameter of the lead wire; and
- a second part of which a width is less than the diameter of the lead wire but flexible to get wider as the diameter of the lead wire,
- wherein the second part includes a curved plane to reduce a frictional force when the lead wire is inserted.

9. The wireless charging device according to claim 1, wherein the fastening part has a pin-type structure prolonged from the connection part, and wherein each of the connection part is extended into two fastening parts.

10. The wireless charging device according to claim 9, wherein the fastening part comprises:

- a body configured to penetrate through the circuit board and the shielding plate;
- a deviation block part configured to avoid that the connection part deviates freely after fastened through the shielding plate; and
- a movement block part configured to avoid that the connection part moves according to vibration after fastened through the shielding plate.

11. The wireless charging device according to claim 10, wherein a thickness of the body is smaller than a diameter of a hole formed in the shielding plate.

12. The wireless charging device according to claim 11, wherein the deviation block part and the movement block part are protruded or bent from the body in the opposite direction with each other.

13. The wireless charging device according to claim 11, wherein a thickness of the fastening part including the deviation block part and the movement block part is larger in a plane dimension of the shielding plate than the diameter of the hole.

14. The wireless charging device according to claim 11, wherein the hole formed in the shielding plate comprises:
- a first portion having a diameter which is larger than a first thickness of the body, the deviation block part and the movement block part; and
- a second portion having a diameter which is engaged with a second thickness of the body and the movement block part.

15. The wireless charging device according to claim 1, wherein the circuit board is a printed circuit board (PCB) including a printed wire for connecting the at least one component with the connector.

16. The wireless charging device according to claim 1, wherein the shielding plate comprises a soldering barrier configured to fix a soldering position when the transmitter is coupled with the connector by soldering and to block a leak of current to an external of the shielding plate.

17. The wireless charging device according to claim 1, wherein the transmitter comprises at least one coil or antenna configured to transmit the power signal.

18. The wireless charging device according to claim 1, wherein the shielding plate includes a material compounded from a Sendust and a Poly Amide.

* * * * *